United States Patent

Ideta et al.

[11] Patent Number: 5,917,240
[45] Date of Patent: Jun. 29, 1999

[54] SEMICONDUCTOR DEVICE SOCKET

[75] Inventors: Yasushi Ideta; Akihiro Washitani; Tsunenori Umetsu; Keiko Kaneko, all of Kikuchi-gun; Kunio Kobayashi, Itami, all of Japan

[73] Assignee: Mitsubishi Denki Kabushiki Kaisha, Tokyo, Japan

[21] Appl. No.: 08/923,254

[22] Filed: Sep. 4, 1997

Related U.S. Application Data

[63] Continuation of application No. 08/545,381, Oct. 19, 1995, Pat. No. 5,693,982, which is a continuation of application No. 08/162,951, Dec. 8, 1993, Pat. No. 5,461,258.

[30] Foreign Application Priority Data

Dec. 8, 1992 [JP] Japan .................................. 4-328264
Dec. 1, 1993 [JP] Japan .................................. 5-301792

[51] Int. Cl.⁶ .................................................. H01L 23/34
[52] U.S. Cl. .......................... 257/723; 257/724; 257/726; 257/727
[58] Field of Search .................................... 257/693, 696, 257/697, 701, 705, 723, 724, 725, 726, 727, 728, 785

[56] References Cited

U.S. PATENT DOCUMENTS 4,715,823  12/1987  Ezura et al. ............................. 439/267
4,764,848  8/1988   Simpson .................................. 361/408
5,045,923  9/1991   Matsuoka ................................ 357/79
5,108,302  4/1992   Pfaff ........................................ 439/266

FOREIGN PATENT DOCUMENTS 61-157290  9/1986  Japan .
62-67483   4/1987  Japan .
63-25477   2/1988  Japan .

*Primary Examiner*—Carl Whitehead, Jr.
*Attorney, Agent, or Firm*—Leydig, Voit & Mayer

[57] ABSTRACT

A semiconductor device test socket for connecting an external circuit to external leads of a semiconductor device to permit testing of the semiconductor device includes a body having a positioning base for supporting roots of external leads of a semiconductor device to be tested. A plurality of movable contact terminals are supported by the body and disposed opposite to the external leads of the semiconductor device when the semiconductor device is supported by the positioning base. The contact terminals are movable between a first position electrically contacting the external leads and a second position spaced from the external leads. The contact terminals are configured so as to be moved to their second positions when a conveyance tool for supporting the semiconductor device to be tested is moved towards the test socket and pressed against the contact terminals, and so as to move to their first positions when the conveyance tool is moved away from the test socket out of contact with the contact terminals.

9 Claims, 8 Drawing Sheets

SEMICONDUCTOR DEVICE SOCKET

This disclosure is a continuation of patent application Ser. No. 08/545,381, filed on Oct. 19, 1995, now U.S. Pat. No. 5,693,982, which is a continuation of prior patent application Ser. No. 08/162,951, filed on Dec. 8, 1993, now U.S. Pat. No. 5,461,258.

BACKGROUND OF THE INVENTION

1. Field of the Invention

The present invention relates to a semiconductor device socket for connecting an external circuit to external leads of a surface package type semiconductor device in order to test the device.

2. Description of the Related Art

FIGS. 13 and 14 are sectional views illustrating the basic structure of a conventional semiconductor device socket. FIG. 13 illustrates a state where movable contact terminals of the socket are open, and FIG. 14 illustrates a state where the movable contact terminals are closed. FIG. 15 is a partial perspective view illustrating only a portion near a semiconductor device which is mounted on a socket. In FIGS. 13, 14 and 15, reference numeral 1 denotes a surface package type semiconductor device (referred to as IC hereinafter); reference numeral 2, a plurality of gull wing-like external leads which extend from both sides of the IC 1, as shown in FIG. 10; and reference numeral 3, a package portion. Each of the external leads 2 has a shoulder 4, a flat end 5, a mounting surface 6 on the rear side of the end 5, and an upper surface 7 on the front side thereof. The mounting surface 6 contacts an electrode (not shown) on a circuit substrate when the IC 1 is actually mounted on the circuit substrate.

Reference numeral 50 denotes a semiconductor device socket comprising a body 20 for mounting the IC 1 thereon, and a movable cover 40 which is provided on the body 20 so as to be vertically movable.

The body 20 has a positioning base 21 for supporting the package portion 3 of the IC 1 and positioning the IC 1, terminal guides 22 for guiding the ends 5 of the external leads 2 of the IC 1 and aligning the movable contact terminals 30 described below, and a lead end supporting surface 23 for supporting the mounting surface 6 of each of the external leads 2. Reference numeral 30 denotes the movable contact terminal provided in correspondence with each of the external leads 2. The movable contact terminals 30 are provided in a row on both sides of the positioning base 21 outside the positioning base 21 in correspondence with the respective external leads 2, and the terminal guides 22 are provided between the respective movable contact terminals 30. In a socket for a QFP (Quad Flat Package) type semiconductor, the movable contact terminals 30 are provided on each of the four sides. Each of the movable contact terminals 30 has a lever portion 31, a contact portion 32, and a terminal portion 33 for electrical connection with an external circuit (not shown).

The movable cover 40 has an opening 41 for getting the IC 1 in and out of the socket 50, the IC 1 being mounted on the positioning base 21 through the opening 41 while the external leads 2 are respectively guided by the terminal guides 22. The movable cover 40 also has an engagement portion 42 on the rear side thereof, which has an arcuate surface 43 contacting the lever portion 31 of each of the movable contact terminals 30 to open and close each of the movable contact terminals 30 as the movable cover 40 is vertically moved.

The operation of the conventional semiconductor device socket is described below.

When the movable cover 40 of the socket 50 is downwardly moved to engage the body 20, as shown in FIG. 13, the lever portion 31 of each of the movable contact terminals 30 is forced open by the arcuate surface 43 on the rear side of the movable cover 40, and the contact portion 32 is upwardly retracted along a circular arc. In this state, the IC 1 is mounted on the positioning base 21 of the body 20, as shown in FIG. 13.

When the pressure pushing down the movable cover 40 is removed, each of the movable contact terminals 30 made of an elastic metal material such as BeCu or the like is returned to the closed state by its own elastic force, and the contact portion 32 consequently pushes the upper surface 7 at the end 5 of the corresponding external lead 2 of the IC 1. At the same time, the movable cover 40 is pushed up by the elastic force of each of the movable contact terminals 30 and separated from the body 20. In this state, the contact portion 32 of each of the movable contact terminals 30 pushes the upper surface 7 at the end 5 of the corresponding external lead 2 supported on the lead end supporting surface 23 of the body 20, as described above, thereby achieving electrical connection between the movable leads 2 and the respective corresponding external leads 2. The above operation causes the IC 1 to be mounted on and separated from the socket 50 in order to perform tests such as the electrical characteristic test and burn-in screen test of the IC.

In the conventional semiconductor device socket configured as described above, the ends of the external leads of the IC respectively electrically contact the movable contact terminals on the socket side. However, since a solder coating (not shown) is previously placed on the end of each of the external leads when the IC is mounted on the circuit substrate, and since the lead end contacts directly an electrode on the circuit substrate when the IC is mounted on the circuit substrate, and is thus required to be planar, it is undesirable that the ends of the external leads make electrical contact. This is due to the following problems:

(1) If the lead ends make electrical contact, since the contact terminals on the socket side are pressed, the solder coating is separated.

In addition, when an IC having resin burrs which adhere to portions between the respective external leads is mounted on the socket in order to perform function tests in the course of the production of the IC or immediately after the production, various foreign materials A such as the mold burrs separated from the portions between the external leads of the IC package portion, fiber flocks of the clothing of the workers etc. in the room remain and are deposited on the body including the lead end supporting surface 23 of the socket, as shown in FIG. 15. If the mounting surfaces at the ends of the external leads of the IC are pressed on the surface of the body of the socket in this state, the foreign materials A sometimes adhere to the mounting surfaces of the external leads. This causes the following problems:

(2) When a test for electrical connection of the mounting surfaces of the external leads is then performed, or when the IC is actually mounted on the circuit substrate, the foreign materials which adhere to the mounting surfaces cause poor electrical contact; and (3) Since a force is applied in the state where the foreign materials adhere, the lead ends are deformed, as shown by portion B in FIG. 15, thereby causing a defective product.

SUMMARY OF THE INVENTION

The present invention has been achieved for solving the above problems, and an object of the present invention is to provide a semiconductor device socket which can prevent the adhesion of foreign materials to the mounting surfaces of external leads of IC and the deformation of the lead ends respectively including the mounting surfaces.

In order to achieve the object, in accordance with a first embodiment of the present invention, a semiconductor device socket for connecting an external circuit to the external leads of a semiconductor device in order to test the device, comprises a body and a movable cover. The body supports the mounting surface at the end of each of the external leads of the semiconductor device and comprises movable contact terminals provided opposite to the respective external leads of the semiconductor device. The movable cover is provided on the body so as to be vertically movable so that the semiconductor device can be mounted when the movable cover is downwardly moved to connect with the body, and the movable contact terminals respectively press the shoulders or inclined portions of the external leads of the semiconductor device when the movable cover is upwardly moved to be separated from the body.

In accordance with a second embodiment of the present invention, each contact portion of the movable contact terminals of the semiconductor device socket in accordance with the first embodiment has a projection having a wiping effect, cutting off thin burrs remaining on a shoulder of each of the external leads when contacting the shoulder.

In accordance with a third embodiment of the present invention, a semiconductor device socket for connecting an external circuit to external leads of a semiconductor device in order to test the device, comprises a body and a movable cover. The body supports the semiconductor device and comprises a lead end supporting surface for supporting the mounting surfaces at the ends of the external leads of the semiconductor device, and movable contact terminals disposed opposite to the external leads of the semiconductor device. The movable cover is provided on the body so as to be vertically movable so that the semiconductor device can be mounted when the movable cover is moved to combine with the body, and the movable contact terminals respectively press the face sides of the mounting surfaces of the external leads of the semiconductor device when the movable cover is moved to be separated from the body.

In accordance with a fourth embodiment of the present invention, a semiconductor device socket for connecting an external circuit to external leads of a semiconductor device in order to test the semiconductor device, comprises a body and a movable cover. The body supports the semiconductor device and comprises a lead end supporting surface for supporting mounting surfaces of external leads of the semiconductor device, and movable contact terminals disposed opposite to the external leads of the semiconductor device. The movable cover is provided on the body so as to be vertically movable so that the semiconductor device can be mounted when the movable cover is moved to combine with the body, and the movable contact terminals respectively press the face sides of the mounting surfaces of the external leads of the semiconductor device when the movable cover is moved to be separated from the body. The lead end supporting surface of the body respectively has resilient movable projecting members which project therefrom and which are provided on portions corresponding to the mounting surfaces of the external leads. The movable projecting members are pushed down to a position on or below the level of the lead end supporting surface level when pressed by the movable contact terminals.

In accordance with a fifth embodiment of the present invention, a semiconductor device socket for connecting an external circuit to external leads of a semiconductor device in order to test the semiconductor device, comprises a body and a movable cover. The body comprises an IC supporting surface for supporting the semiconductor device, and movable contact terminals disposed opposite to external leads of the semiconductor device. The movable cover is provided on the body so as to be vertically movable so that the semiconductor device can be mounted when the movable cover is moved to combine with the body, and the movable contact terminals contact the face sides of the mounting surfaces of the external leads of the semiconductor device when the movable cover is moved to be separated from the body. The IC supporting surface of the body is provided with projecting positioning guides for positioning the semiconductor device while contacting both sides of a package portion.

In accordance with a sixth embodiment of the present invention, a semiconductor device socket for connecting an external circuit to external leads of a semiconductor device in order to test the semiconductor device at a different temperature, comprises a body for supporting the semiconductor device in the state where the mounting surfaces at the ends of the external leads float. The body comprises movable contact terminals provided opposite to the external leads of the semiconductor device. Each of the movable contact terminals is made of the shape memory alloy so as to memorize a sharp in the state when the movable contact terminals press the external leads, and to return to the memorized state at a test temperature.

In the semiconductor device socket in accordance with the first embodiment, the electrical contact between the external leads of the semiconductor device and the movable contact terminals on the connector side is achieved by the shoulders or the inclined portions of the external leads, and when the semiconductor device is mounted on the socket, the semiconductor device is supported by the sides of the shoulders of the external leads on the rear side thereof, and the mounting surfaces of the external leads float, i.e., do not contact the socket. It is thus possible to prevent adhesion of foreign materials to the mounting surfaces. In addition, the ends of the external leads do not make electrical connection, thereby preventing the lead ends from being deformed by the pressure acting thereon at the time of the test.

In the semiconductor device socket in accordance with the second embodiment, since, in the socket of the first embodiment, the thin burrs produced in the formation of the package portion remain on the shoulders of the external leads which contact the contact portions of the movable contact terminals, the contact portion of each of the movable contact terminals includes a projection having sharp form so as to cut off the thin burrs when contacting the corresponding shoulder, thereby reliably obtaining good electrical contact.

In the semiconductor device socket in accordance with the third embodiment, although electrical connection between the external leads and the movable contact terminals is achieved by the ends of the external leads, the lead end supporting surface of the socket body for supporting the mounting surfaces of the external leads is formed in a shape or made of a material which prevents deposition and retention of foreign materials by including irregularities or bonding with a conductive material so as to prevent the generation of static electricity. It is thus possible to decrease the adhesion of foreign materials to the mounting surfaces of the external leads.

In the semiconductor device socket in accordance with the fourth embodiment, the lead end supporting surface of the socket body is provided with movable projecting members each of which has a resilience lower than that of the movable contact terminals, which respectively upwardly project from the lead end supporting surface when not being pressed by the contact portions of the movable contact terminals, and which are respectively provided in correspondence with the external leads so that foreign materials hardly deposit and remain on the movable projecting members in contact with the mounting surfaces of the external leads. It is thus possible to decrease the adhesion of foreign materials to the mounting surfaces of the external leads.

In the semiconductor device socket in accordance with the fifth embodiment, the IC positioning means comprises projecting positioning guides, each of which has, for example, a conical or truncated conical shape, which makes point contact with the sides of the package portion, and which are provided on the IC supporting surface of the socket body, so that the deposition and retention of foreign materials can be decreased, and the foreign materials can easily be cleaned off. It is thus possible to decrease the adhesion of the foreign materials to the mounting surfaces of the external leads.

In the semiconductor device socket for testing at a different temperature in accordance with the sixth embodiment, each of the movable contact terminals is made of a shape memory alloy which memorizes a shape in the state where the movable contact terminal contacts the corresponding external lead, and which returns to the memorized shape at a test temperature so as to automatically have a shape for pressing the corresponding external lead when being placed in an environment at the test temperature. This makes it unnecessary to provide a movable cover for opening and closing the movable contact terminals on the socket. In addition, the movable contact terminals are opened by a cam portion or the like which is formed on a conveyance tool provided separately from the socket so as to convey, for example, the IC, with vacuum tweezers to the sock

DESCRIPTION OF THE PREFERRED EMBODIMENTS

Embodiments of the present invention are described below with reference to the drawings.

Embodiment 1

Figure 1:
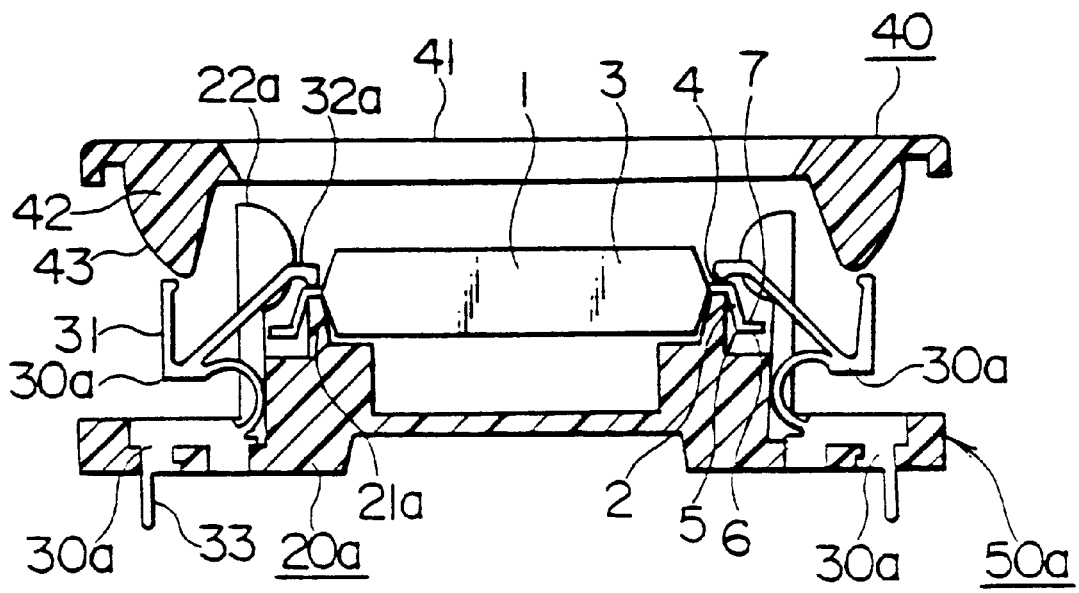
FIG. 1 is a sectional view illustrating a semiconductor device socket in accordance with a first embodiment of the present invention.

FIG. 1 is a sectional view illustrating a semiconductor device socket in accordance with a first embodiment of the present invention. In FIG. 1, the same portions as those of a conventional socket are denoted by the same reference numerals. The semiconductor device socket 50a comprises the body 20a on which the IC 1 is mounted, and the movable cover 40 provided on the body 20a so as to be vertically movable, the body 20a and movable cover 40 being integrally provided. In this embodiment, the positioning base 21a formed on the body 20 positions and supports the IC 1 so as to support the shoulder 4 of each of the external leads 2 of the IC 1 while the mounting surface 6 at the end 5 of each of the external leads 2 floats without contacting any portion. The package portion 3 of the IC 1 also floats. On the other hand, the contact portion 32a of each of the resilient movable contact terminals 30a is extended so as to contact the shoulder 4 of each of the external leads 2 supported by the positioning base 21a. It is thus preferable that each of the terminal guides 22a be wider than a conventional one according to demand, as shown in FIG. 1. It is also preferable that movable terminal guides 22a which move in accordance with the movement of the movable contact terminals 30a be provided. FIG. 1 shows the state where the IC 1 is mounted on the socket 50, and the contact portions of the movable contact terminals 30a respectively contact and press against the shoulders 4 of the external leads 2.

The operation of the embodiment is described below. The basic structure and operation for mounting or separating the IC 1 on or from the socket 50a are as described above with reference to the conventional socket. In this embodiment, after the IC 1 is positioned on the positioning base 21a provided on the body 20a of the socket 50, when the movable cover 40 is returned to the state (separation position) shown in FIG. 1, the contact portions 32a of the movable contact terminals 30a respectively contact the shoulders 4 of the external leads 2 of the IC 1 and press against them. In this state, since the mounting surfaces 6 at the ends 5 of the external leads 2 float without contacting the socket 50a, no foreign materials (mold scraps of the IC package, fiber flocks, etc) adhere to the mounting surfaces.

Figure 2:
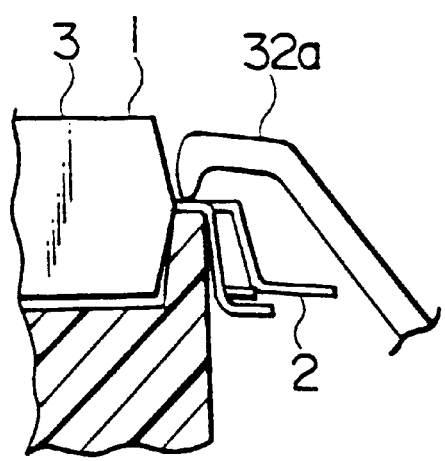
FIG. 2 a partial sectional view illustrating the relation between the socket and the shape of an external lead of the semiconductor device shown in FIG. 1.

It is thus possible to prevent separation of the solder (not shown) coating from the lead ends 5, and the poor contact caused by the adhesion of the foreign materials to the mounting surfaces 6. In addition, since the lead ends 5 do not make electrical contact, it is also possible to prevent the deformation of the lead ends 5 which are required to be planar. There is only a little possibility of deformation of the external leads 2 because the contact portions 32a of the movable contact terminals 30a are respectively pressed by the strong shoulders 4 of the external leads 2. Further, since the shoulders 4 of the external leads 2, i.e., the roots of the external leads 2, contact the contact portions 32a of the movable contact terminals 30a, the socket can be used for IC having external leads of different forms, as shown in FIG. 2, if the size of the package portion 3 and the pitch of the external leads 2 are the same.

Figure 3:
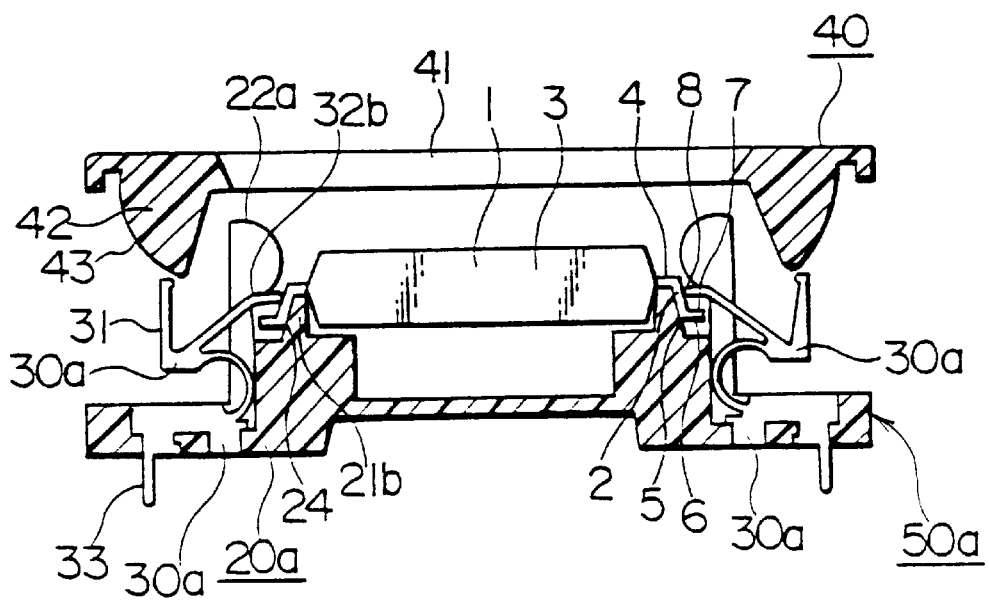
FIG. 3 is a sectional view illustrating a modified embodiment of the semiconductor device socket in accordance with the first embodiment of the present invention.

FIG. 3 is a sectional view illustrating a modified version of a semiconductor device socket in accordance with the first embodiment of the present invention. Although FIG. 1 shows the embodiment in which the shoulder 4 of each of the external leads 2 of the IC 1 makes electrical contact, FIG. 3 shows the embodiment in which the inclined portion of each of the external leads makes electrical contact. In this embodiment, the contact portion 32b of each of the movable contact terminals 30a is formed so as to contact the inclined portion 8 of each of the external leads 2 and press against them. The positioning base 21b of the body 20a has a shape having a lead end supporting surface 24 parallel with the inclined portions 8 of the external leads 2 in order to support the inclined portions of the external leads 2 when the inclined portions 8 are pressed by the movable contacts.

This structure prevents the mounting surfaces 6 of the external leads 2 from contacting the socket 50a and thus prevents the poor contact and deformation which are caused by separation of the solder from the lead ends 5 and adhesion of foreign materials thereto, as in the arrangement shown in FIG. 1.

Embodiment 2

FIGS. 4A to 4D are partial perspective views illustrating examples of the contact portions of movable contact terminals of a semiconductor device socket in accordance with a second embodiment. In each of the above embodiments, the shoulders of the external leads of the IC make electrical contact with the contact terminals on the socket side. However, since the thin burrs 3a (refer to FIG. 4), which are produced when the package portion 3 is formed by molding, remain on the shoulders 4 at the roots of the external leads 2, there is the possibility that good electrical contact between the external leads and the contact terminals cannot be obtained due to the thin burrs 3a of an insulating resin.

Figure 4A:
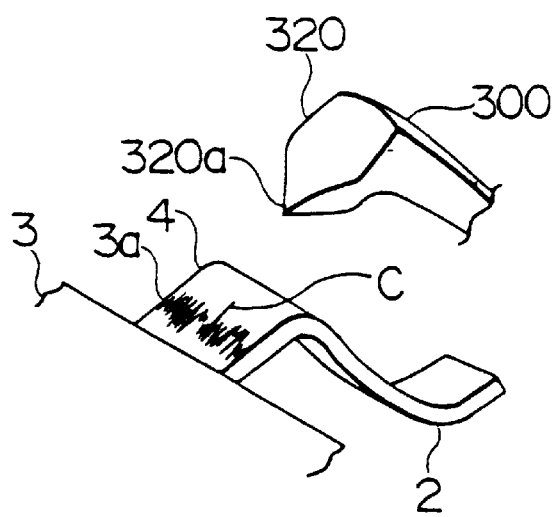
FIGS. 4A to 4D are partial perspective views illustrating examples of movable contact terminals of a semiconductor device socket in accordance with a second embodiment of the present invention.
Figure 4B:
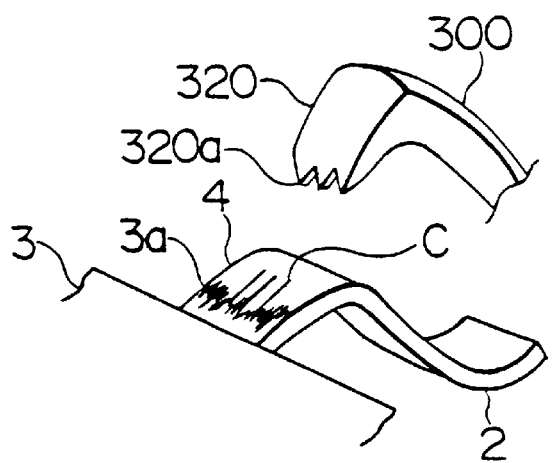
Figure 4C:
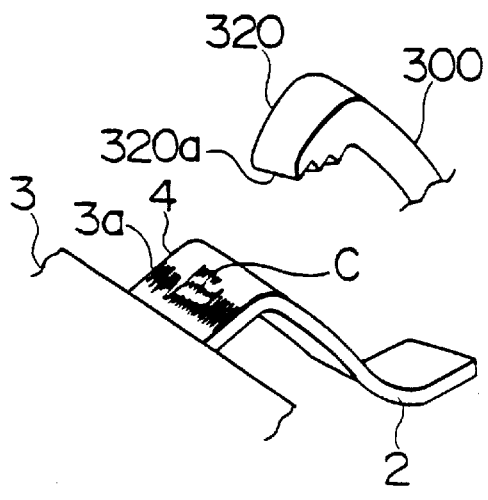
Figure 4D:
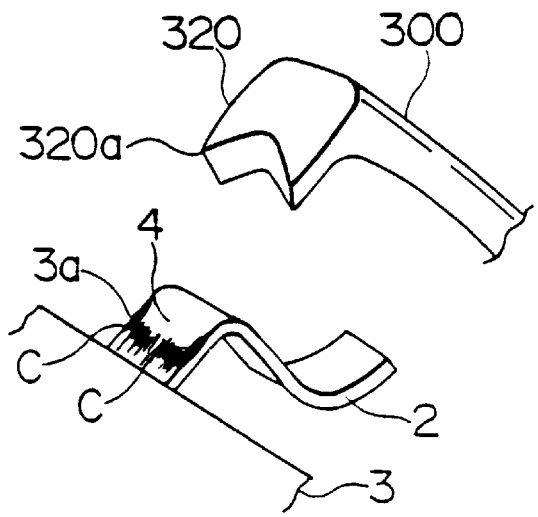

In this embodiment, the contact portion 320 of a movable contact terminal 300 has projections 320a, as shown in each of FIGS. 4A to 4D. In each of the drawings, character C denotes the wiping marks produced on the shoulder 4 of each of the external leads 2 by the sharp form projections 320a of the contact portion 320. FIG. 4A shows one line mark, FIG. 4B shows three line marks, FIG. 4C shows three lateral jagged marks, and FIG. 4D shows wiping marks on both sides of the shoulder 4. In this way, the contact portion 320 of each of the movable contact terminals 300 has a sharp end projection so as to have the wiping effect of cutting off the thin burrs 3a and reliably obtain the desired electrical connection between the external leads 2 and the movable contact terminals 300. The shape of the projection 320a of the contact portions 320 is not limited to the shapes shown in FIGS. 4A to 4D.

Figure 5:
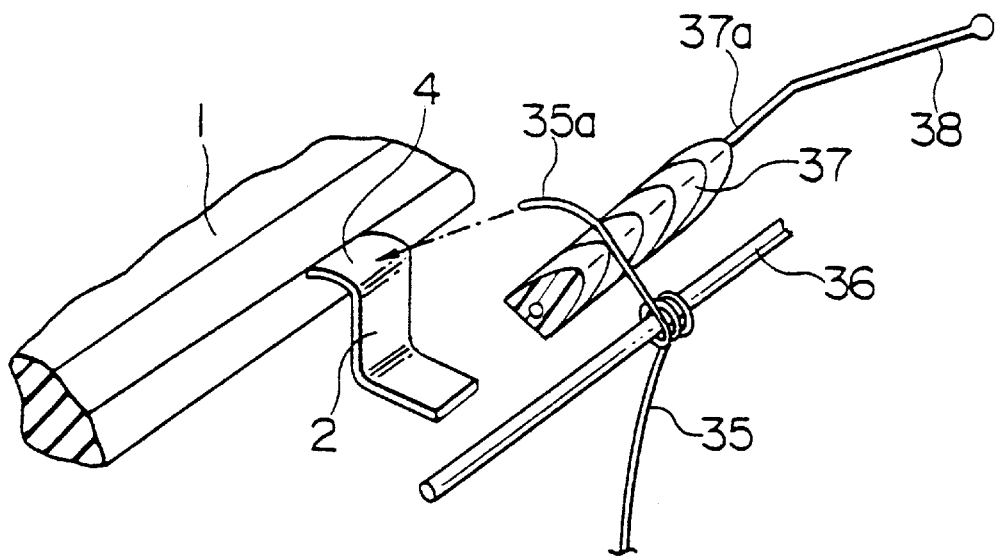
FIG. 5 is a partial perspective view illustrating another example of the movable contact terminals of the semiconductor device socket.
Figure 11:
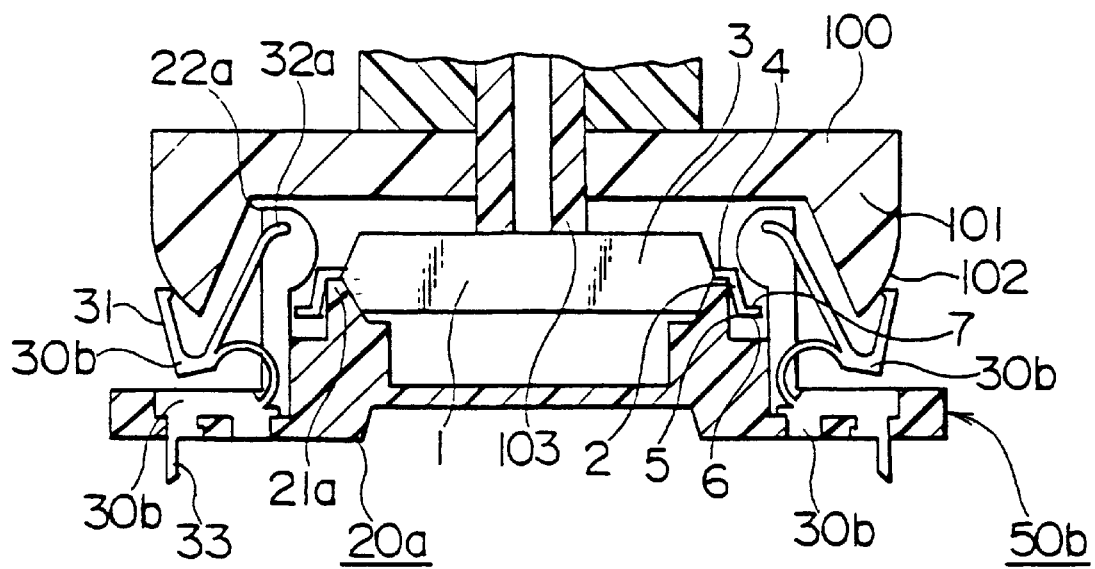
FIG. 11 is a sectional view illustrating a semiconductor device socket in accordance with a sixth embodiment of the present invention in the state where movable contact terminals are open.

FIG. 5 is a partial perspective view illustrating another example of the movable contact terminals of the semiconductor device socket in accordance with the first and second embodiments of the present invention. In this embodiment, each of the movable contact terminals is a helical spring type contact terminal. As shown in FIG. 5, helical spring type contact terminals 35 are provided on a shaft 36 which extends parallel to a row of the external leads 2 of the IC 1, in correspondence with the respective external leads 2, so as to respectively contact the shoulders 4 of the corresponding external leads 2 by their resilience upon operation of a cam 37 extending parallel to the shaft 36. The contact terminals 35 also respectively press the shoulders 4 to produce good contact pressure for electrical connection. The cam 37 is rotated around a cam shaft 37a by moving a lever 38. The lever 38 is moved by, for example, operation of the movable cover 40. In a socket without the movable cover, as in Embodiment 6 shown in FIGS. 11 and 12 described below, the lever 38 is moved by operation of a conveying tool 100 for conveying the IC 1 with vacuum tweezers, which is shown in FIG. 11.

The springiness, i.e., the resiliency, of each of the helical spring type contact terminals 35 can be adjusted by changing the number of turns of the spring. The resilience of the helical spring type contact terminals 35 can easily be changed, as compared with the contact terminals of the above embodiments, which are equally formed by punching a metallic plate. The resilience can also be maintained for a long period.

Embodiment 3

Figure 6:
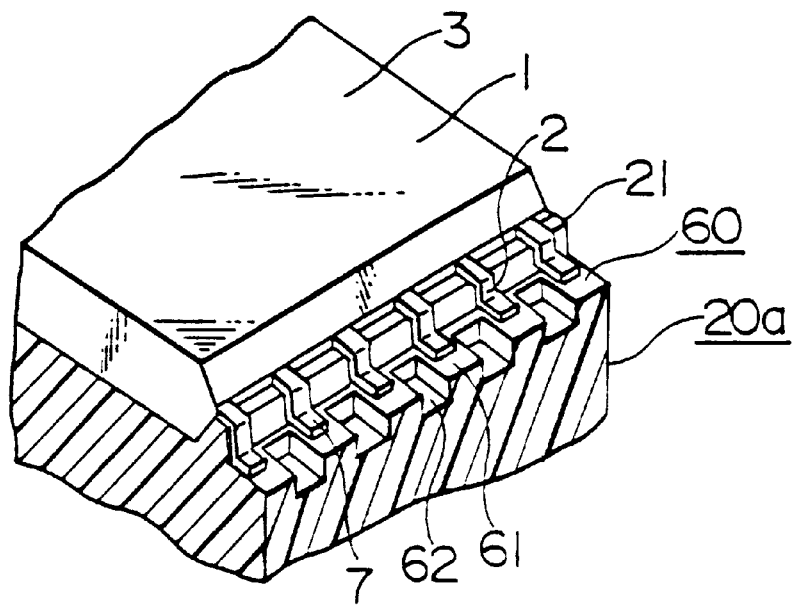
FIG. 6 is a partial perspective view illustrating a semiconductor device socket in accordance with a third embodiment of the present invention.

FIG. 6 is a partial perspective view illustrating a semiconductor device socket in accordance with a third embodiment of the present invention. In this embodiment, when the contact portions of the contact terminals are respectively pressed by the ends of the external leads of a IC to make electrical contact therebetween, as in the prior art shown in FIGS. 13 and 14, foreign materials hardly deposit or remain on the socket body. In this embodiment, each of lead end supporting surfaces 60 for respectively supporting the mounting surfaces of the external leads 2 on the outside of the positioning base 21 of the socket body 20a is formed so that a portion for supporting the mounting surface of each of the external leads 2 is a convex portion 61 having a minimum necessary area, i.e., all portions which do not contact the mounting surfaces are recessed portions 62. As a result, foreign materials hardly deposit and remain on the convex portions 61. Even if the ends 5 of the external leads 2 are supported by the lead end supporting surface 60 of the socket body 20a in contact therewith, it is thus possible to decrease the adhesion of foreign materials and decrease the occurrence of poor contact, which is caused by adhesion of foreign materials, and deformation of the ends 5 of the external leads 2.

Figure 7:
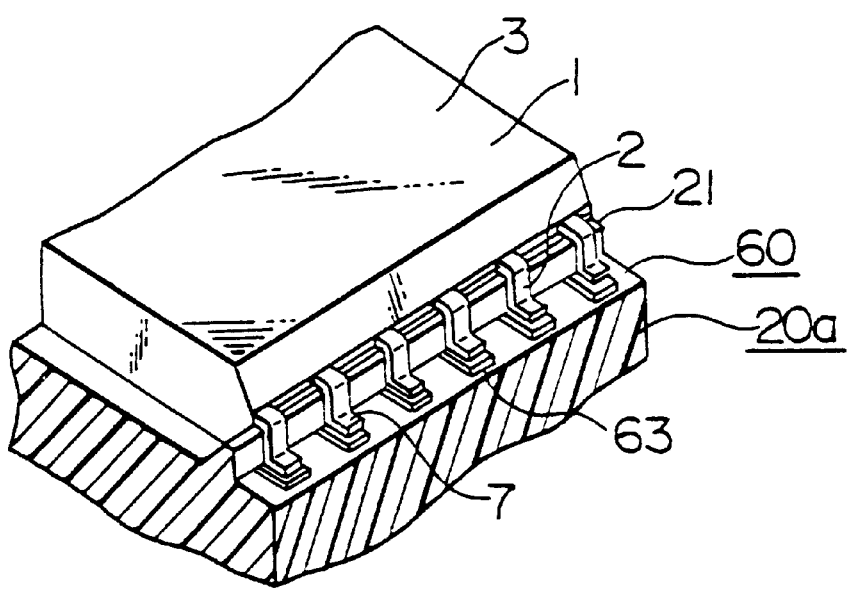
FIG. 7 is a partial perspective view illustrating a modified embodiment of the semiconductor device socket in accordance with the third embodiment of the present invention.

FIG. 7 is a partial perspective view illustrating a modified version of the semiconductor device socket in accordance with the third embodiment of the present invention. In this embodiment, a conductive metallic material 63 of Au, Ag, Al, Cu, Cu alloy, W, Ti, Ni or Ni alloy is attached to portions of the lead end supporting surface 60 for supporting the mounting surfaces 6 of the external leads on the outside of the positioning base 21 of the socket body 20a. This can prevent charging with static electricity which causes adhesion of foreign materials, and can thus decrease the adhesion of foreign materials to the mounting surfaces 6 of the external leads 2 and decrease the occurrence of poor contact and deformation of the lead ends.

The conductive material 63 may be provided on each of the convex portions 61 of the lead end supporting surface 60 having irregularities shown in FIG. 6 so that the adhesion of foreign materials to the mounting surfaces 6 of the external leads 2 can further be decreased.

Embodiment 4

Figure 8:
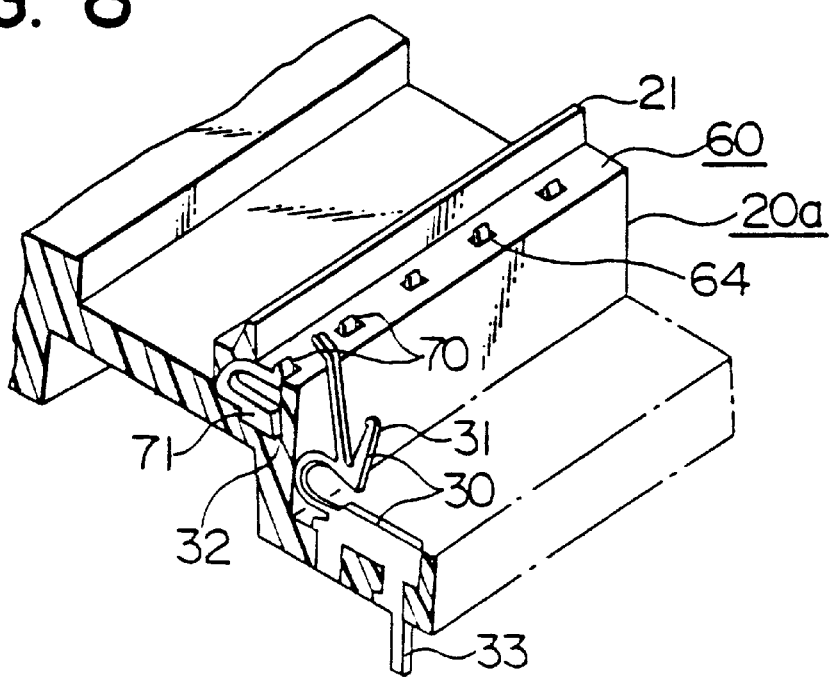
FIG. 8 is a partial perspective view with a sectional portion illustrating a semiconductor device socket in accordance with a fourth embodiment of the present invention in the state where movable contact terminals are open.
Figure 9:
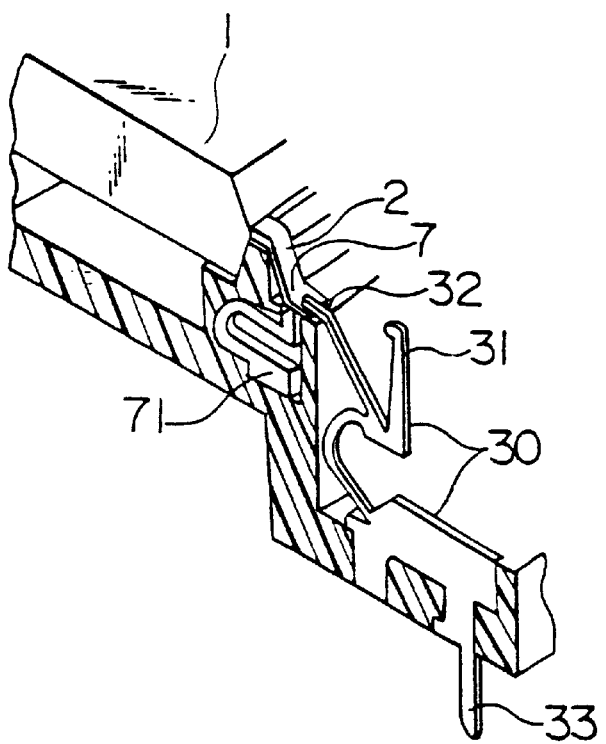
FIG. 9 is a partial perspective view with a sectional portion illustrating a semiconductor device socket in accordance with the fourth embodiment of the present invention in the state where movable contact terminals are closed.

FIGS. 8 and 9 are partial perspective views with sectional portions respectively illustrating a semiconductor device socket in accordance with a fourth embodiment of the present invention. In this embodiment, a movable projecting member 70 having lower elasticity than that of the movable contact terminals 30 is provided on each of the portions of the lead end supporting surface 60, which respectively contact the mounting surfaces 6 of the external leads so as to support the mounting surfaces 6 of the external leads 2 of the IC 1. In the state where the IC 1 is not mounted on the socket, as shown in FIG. 8, each of the movable projecting members 70 for contacting the mounting surfaces 6 of the external leads 2 thus upwardly projects from the lead end supporting surface 60 through a corresponding hole 64. The foreign materials thus hardly deposit on the movable projecting members 70, as compared with other portions of the lead end supporting surface 60, thereby decreasing the adhesion of the foreign materials to the mounting surfaces 6 of the external leads 2. In the state where the IC 1 is mounted on the socket, as shown in FIG. 9, since the pressure of the movable contact terminals 30 is higher than the elasticity of the movable projecting members 70, the movable projecting members 70 are pushed down to the same height as that of the lead supporting surface 60.

As an embodiment of the movable projecting members 70, spring mechanisms 70 having lower elasticity than that of the movable contact terminals 30 may be contained in a portion below the lead end supporting surface 60, and the ends of the spring mechanisms 70 are projected as the movable projecting members from the holes formed in the supporting surface 60.

The movable projecting members 70 must be projected from the supporting surface 60 to a height higher than that of the deposit of foreign materials on the supporting surface 60 in the state where the IC is not mounted. The end of each of the movable projecting members 70 is preferably small and is rounded for preventing deposition of the foreign materials.

In this embodiment, not only the pressure caused by the elasticity of the movable contact terminals 30 but also the pressure of the movable projecting members 70 which is caused by the spring mechanisms, are applied to the upper sides 7 of the mounting surfaces 6 of the external leads, thereby producing a strong contact force between the upper sides 7 of the external leads 2 and the contact portions 32 of the movable contact terminals 30, and better electrical contact therebetween.

Embodiment 5

Figure 10:
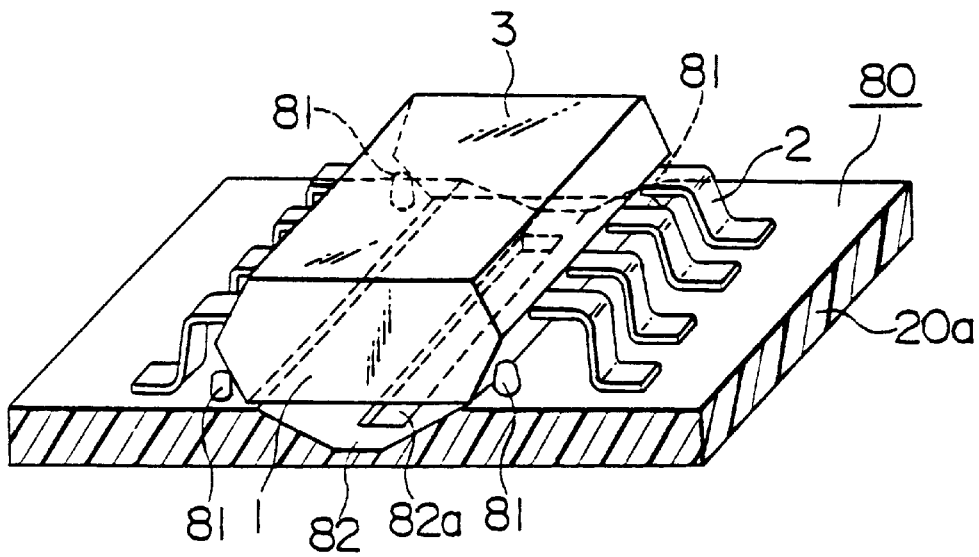
FIG. 10 is a partial perspective view illustrating a semiconductor device socket in accordance with a fifth embodiment of the present invention.

FIG. 10 is a partial perspective view illustrating a semiconductor device socket in accordance with a fifth embodiment of the present invention. In this embodiment, four projecting positioning guides 81 are provided as positioning guides for precisely positioning the IC 1 on the IC supporting surface 80 of the socket body 20a for supporting the package portion 3 of the IC 1 and the mounting surfaces of the external leads 2 so that the four projecting positioning guides 81 contact the four corners of the package portion 3.

Each of the projecting positioning guides 81 has, for example, a conical or truncated conical form. A V-shaped groove 82 for guiding the foreign materials deposited on the IC supporting surface 80 is also provided in the IC supporting surface 80 below the package portion 3 of the IC 1.

Figure 15:
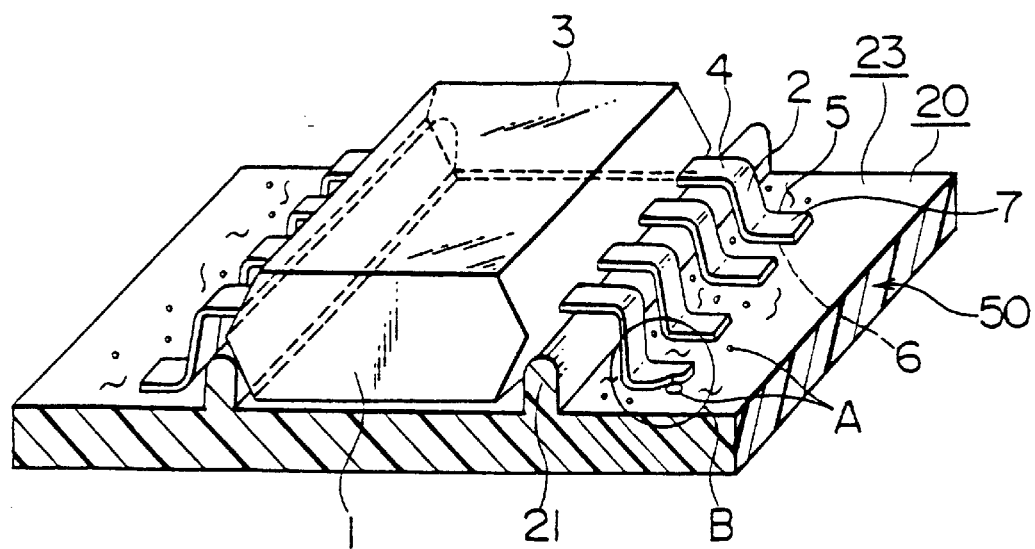
FIG. 15 is a partial perspective view illustrating the state where a semiconductor device is mounted on a conventional semiconductor device socket.

In a conventional structure, since the positioning base comprises a wall-like projecting portion (positioning base 21) having substantially the same length as that of one side of the IC 1, as shown in FIG. 15, foreign materials easily deposit and remain on the body 20. In addition, since the wall-like projecting portion extends over substantially the same length as that of one side of the IC 1, much labor is required for cleaning off the foreign materials. In this embodiment, therefore, the positioning guides are conical or truncated conical projecting positioning guides 81 which are provided in contact with the four corners of the package portion 3 of the IC 1 so as to make point contact with the package portion 3 of the IC 1 without interfering with the external leads 2. The package portion 3 of the IC 1 is thus guided by members having a minimum length. In addition, since the V-shaped groove 82 is formed below the package portion 3 of the IC 1, it is possible to decrease the deposition and retention of the foreign materials on the surface of the IC supporting surface 80 and easily clean off the deposited foreign materials, thereby decreasing the adhesion of the foreign materials to the mounting surfaces 6 of the external leads 2. The number and position of the projecting positioning guides 81 are not limited to those described above.

Embodiment 6

Figure 12:
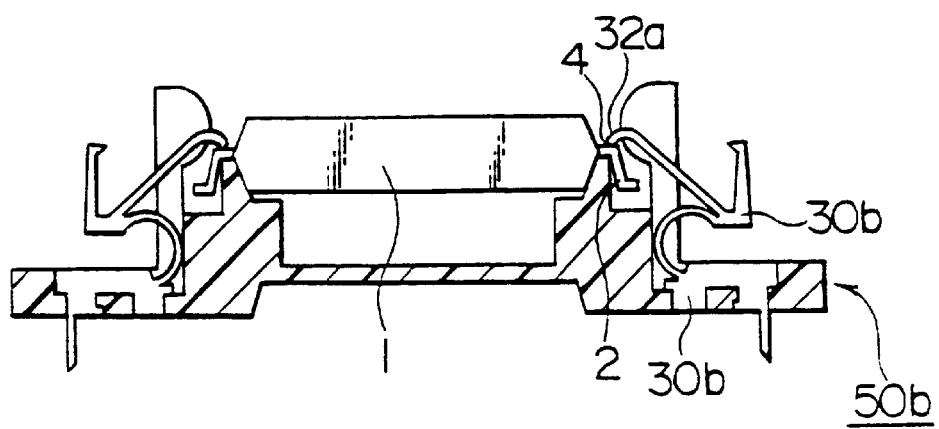
FIG. 12 is a sectional view illustrating a semiconductor device socket in accordance with the sixth embodiment of the present invention in the state where the movable contact terminals are closed.

FIGS. 11 and 12 are sectional views illustrating a semiconductor device socket in accordance with a sixth embodiment of the present invention. FIG. 11 shows the state where the movable contact terminals of the socket are open, and FIG. 12 shows the state where the movable contact terminals are closed. This embodiment is applied to a socket on which a IC is mounted for testing, for example, in a high-temperature environment. Each of the movable contact terminals of the socket of Embodiment 6 is made of a shape memory alloy so that the movable cover of the socket is made unnecessary. As shown in FIGS. 11 and 12, a semiconductor device socket 50b comprises a body 20a without a movable cover. In the socket 50b, the same or equivalent portions as or to those of Embodiment 1 are denoted by the same reference numerals. In this embodiment, each of the movable contact terminals 30b is made of a shape memory alloy, for example, comprising a nickel-titanium (NiTi) alloy or a copper alloy (CuAlNi) (CuAuZn). At a high temperature, the movable contact terminals 30 have a shape in which the contact terminals respectively contact the external leads 2 of the IC 1. Namely, the shape at a high temperature is memorized. In FIG. 11, reference numeral 100 denotes a conveyance tool for conveying the IC 1 with vacuum tweezers. Particularly, the conveyance tool 100 is provided with a cam portion 101 having an arcuate surface 102 for opening each of the movable contact terminals 30 in place of the movable cover. Reference numeral 103 denotes a suction head for grasping the IC 1 by suction.

The operation is described below. When the IC 1 is conveyed to a position above the socket 50b by the conveyance tool 100, as shown in FIG. 11, each of the movable contact terminals 30 is deformed and opened by the force applied from the arcuate surface 102 of the cam portion 101 of the conveyance tool 100. FIG. 11 shows the state where the IC 1 is mounted on the positioning base 21a of the body 20a in the open state.

When the socket 50b equipped with the IC 1 is placed in an environment at a high temperature (about 80° C. to 150°

C.) for the burn-in test of the IC 1 after the conveyance tool 100 is removed, as shown in FIG. 12, each of the movable contact terminals 30b comprising a shape memory alloy returns to the memorized shape at a high temperature, in which each of the contact portions 32a contacts the shoulders 4 of the corresponding external leads 2. In this state, the burn-in test is performed. After the burn-in test is completed, the conveyance tool 100 is moved to a position above the socket 50b, and each of the movable contact terminals 30b is opened by the arcuate surface 102 of the cam portion 101. In this state, the IC 1 is attached to the suction head 103 and is separated from the socket 50b.

In this way, since each of the movable contact terminals of the socket is made of a shape memory alloy, the movable cover need not be provided on the socket, thereby simplifying the structure of the socket.

This embodiment can also be applied to the sockets of the other embodiments, and the same effects can be obtained.

Figure 13:
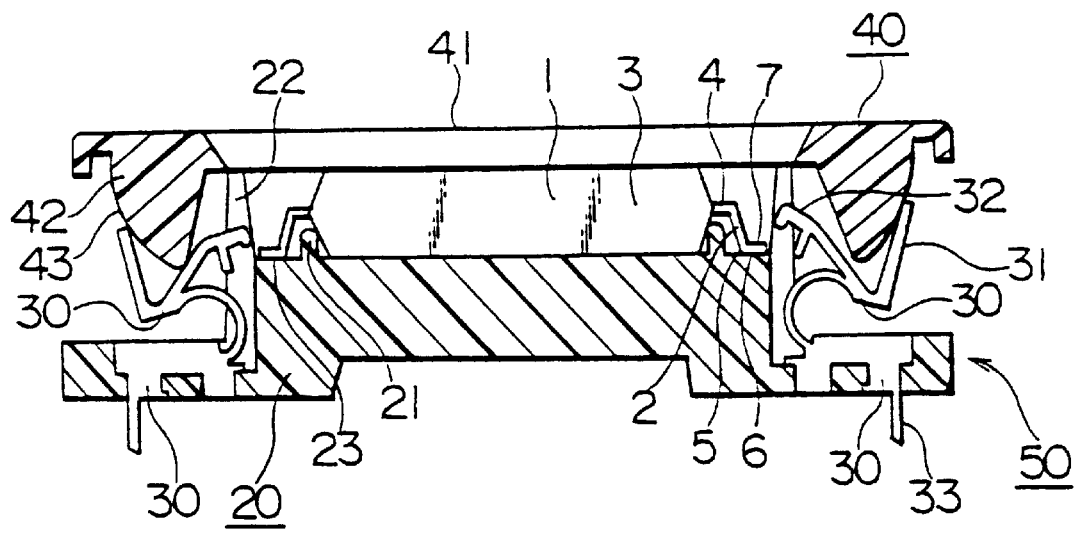
FIG. 13 is a sectional view of a conventional semiconductor device socket in the state where movable contact terminals are open.
Figure 14:
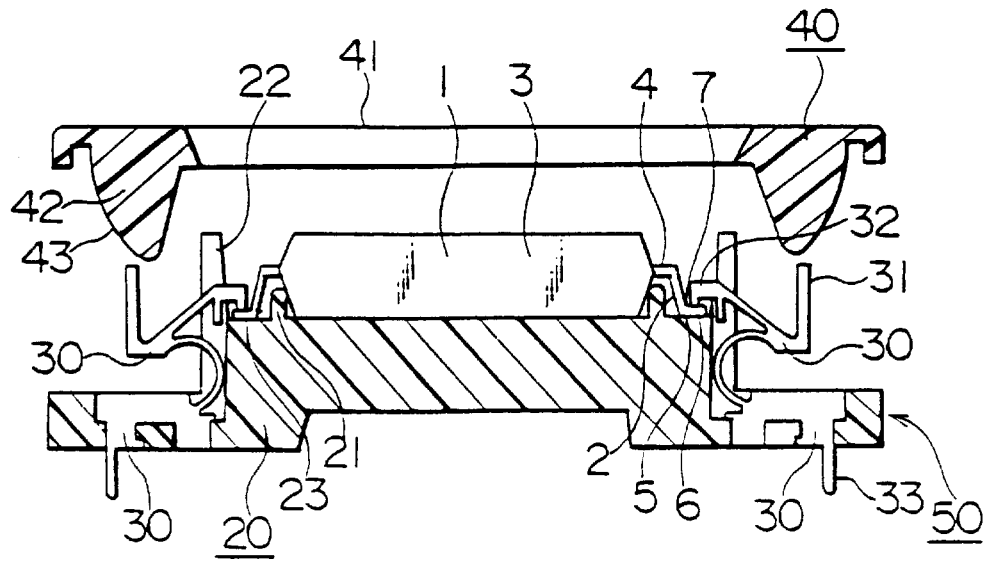
FIG. 14 is a sectional view of a conventional semiconductor device socket in the state where movable contact terminals are closed.

This embodiment can also be applied to the conventional socket shown in FIGS. 13 and 14. When this embodiment is applied to the conventional socket, since the movable cover 40, for example, shown in FIG. 13 is unnecessary, the lead end supporting surface 23 of the socket body 20 can easily cleaned, and the adhesion of burrs to the mounting surfaces 6 of the external leads 2 of the IC 1 can be decreased.

As described above, in the semiconductor device socket in accordance with the first embodiment, electrical contact between the external leads of the semiconductor device and the movable contact terminals on the connector side is achieved by the shoulders or the inclined portions of the external leads. When the semiconductor device is mounted on the socket, the semiconductor device is supported by the sides of the shoulders of the external leads on the rear sides thereof, and the mounting surfaces at the ends of the external leads float, not contacting the socket. This can prevent adhesion of foreign materials to the mounting surfaces. In addition, since the end of each of the external leads does not make electrical connection, it is possible to prevent the lead ends from being deformed by the pressure applied at the test. There are thus the effects of permitting tests of the semiconductor device with high reliability and preventing the occurrence of defective semiconductor devices and thus increasing the yield.

In the semiconductor device socket in accordance with the second embodiment, since the thin burrs produced when the package portion is formed remain on the shoulders of the external leads which respectively contact the contact potions of the movable contact terminals, the contact portion of each of the movable contact terminals of the socket of the first embodiment is formed in a sharp shape for cutting off the thin burrs when contacting the shoulder portions, thereby producing reliable electrical contact. There is thus the effect of increasing reliability.

In the semiconductor device socket in accordance with the third embodiment, although the electrical connection between the external leads and the movable contact terminals is achieved by the ends of the external leads, the lead end supporting surface of the socket body for supporting the mounting surfaces of the external leads is formed in a shape or of a material, which prevents deposition and retention of foreign materials, such as irregularities in or bonding a conductive material for preventing the generation of static electricity to the lead end supporting surface so that the adhesion of foreign materials to the mounting surfaces of the external leads can be decreased. It is thus possible to prevent the occurrence of poor contact caused by the foreign materials, and the deformation of the lead ends, and thus prevent the production of defective semiconductor devices. There is thus the effect of increasing the yield.

In the semiconductor device socket in accordance with the fourth embodiment, movable projecting members having a smaller resilience than that of the movable contact terminals are provided on the lead end supporting surface of the socket body in correspondence with the respective external leads so as to upwardly project from the lead end supporting surface when not pressed by the contact portions of the movable contact terminals. This prevents the deposition and retention of the foreign materials on the movable projecting members in contact with the mounting surfaces of the external leads, and decreases the adhesion of the foreign materials to the mounting surfaces of the external leads. It is thus possible to prevent poor contact caused by the foreign materials and the deformation of the lead ends, perform the test with high reliability and prevent the production of defective semiconductor devices. There are thus the effects of increasing the yield and Producing a strong contact force between the external leads and the movable contact terminals.

In the semiconductor device socket in accordance with the fifth embodiment, means for positioning the IC comprises projecting positioning guides having, for example, a conical or truncated conical shape, and provided on the IC supporting surface of the socket body so as to make point contact with the sides of the package portion of the IC, thereby decreasing the deposition and retention of foreign materials, facilitating cleaning off of the foreign materials and decreasing the adhesion of foreign materials to the mounting surfaces of the external leads. It is thus possible to prevent the poor contact caused by the foreign materials and the deformation of the lead ends, perform the test with high reliability and prevent the production of defective semiconductor devices. There is thus the effect of increasing the yield.

In the semiconductor device socket for testing at a different temperature in accordance with the sixth embodiment, each of the movable contact terminals is made of a shape memory alloy which memorizes the shape in the state where the movable contact terminals respectively contact and press against the external leads, and which returns to the memorized shape at a test temperature so that the movable contact terminals automatically have a shape pressing the external leads when placed in an environment at the test temperature. This makes it unnecessary to provide the movable cover for opening and closing the movable contact terminals on the socket. Each of the movable contact terminals is opened by the cam portion or the like which is formed on the conveyance tool for conveying, for example, a IC, to the socket with vacuum tweezers, the conveyance tool being provided separately from the socket. This can further simplify the structure of the socket and decrease the production cost of the socket. It is thus possible to easily clean off the foreign materials on the socket and prevent poor contact caused by the foreign materials and the deformation of the lead ends.

What is claimed is:

1. A semiconductor device test socket for connecting an external circuit to external leads of a semiconductor device to permit testing of the semiconductor device, comprising:

a body having a positioning base for supporting lower surfaces of roots of external leads of a semiconductor device to be tested; and a plurality of movable contact terminals holding by the body and disposed opposite to the external leads of the semiconductor device when the semiconductor device is supported by the positioning base and movable between a first position electrically contacting upper surfaces of the external leads and a second position spaced from the external leads, the contact terminals being configured so as to be moved to their second positions when a conveyance tool for holding the semiconductor device to be tested is moved towards the test socket and pressed against the contact terminals, and so as to move to their first positions when the conveyance tool is moved away from the test socket out of contact with the contact terminals.

2. A socket as claimed in claim 1 wherein each contact terminal is shaped to exert a contact force on a surface of an external lead of the semiconductor device diagonal to the surface being contacted.

3. An arrangement for use in testing a semiconductor device comprising:

a semiconductor device test socket including a body for supporting a semiconductor device, and a plurality of movable contact terminals each supported by the body and movable between a first position in which it can contact an external lead of a semiconductor device supported by the body and a second position in which it is spaced from the external lead; and a conveyance tool for conveying a semiconductor device to be tested on the test socket and movable between a position in which the conveyance tool contacts the contact terminals and moves them to their second positions and a position in which the conveyance tool is spaced from the contact terminals to permit the contact terminals to move to their first positions.

4. An arrangement as claimed in claim 3 wherein the conveyance tool includes a suction head for supporting a semiconductor device by suction.

5. A method of using a semiconductor device test socket comprising:

moving a conveyance tool for conveying a semiconductor device towards a semiconductor device test socket having a body for supporting a semiconductor device and a plurality of movable contact terminals each movable between a first position in which it can contact an external lead of a semiconductor device supported by the body and a second position in which it is spaced from the external lead;

contacting the contact terminals with the conveyance tool to move the contact terminals to their first positions; and then moving the conveyance tool away from the test socket and out of contact with the contact terminals to permit the contact terminals to move to their second positions.

6. A method as claimed in claim 5 including holding a semiconductor device with the conveyance tool when moving the conveyance tool towards the test socket and leaving the semiconductor device on the base of the test socket when moving the conveyance tool away from the test socket.

7. A method as claimed in claim 6 including electrically testing the semiconductor device on the base of the test socket through the contact terminals.

8. A method as claimed in claim 5 including holding a semiconductor device disposed on the test socket with the conveyance tool and removing the semiconductor device from the test socket when moving the conveyance tool away from the test socket.

9. A socket as claimed in claim 1 wherein the movable contact terminals contact with respective upper surfaces of roots of the external leads of the semiconductor device.

* * * * *